(12) United States Patent
Park

(10) Patent No.: US 7,396,727 B2
(45) Date of Patent: Jul. 8, 2008

(54) TRANSISTOR OF SEMICONDUCTOR DEVICE AND METHOD FOR FABRICATING THE SAME

(75) Inventor: Jeong-Ho Park, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 24 days.

(21) Appl. No.: 11/615,812

(22) Filed: Dec. 22, 2006

(65) Prior Publication Data

US 2007/0166930 A1 Jul. 19, 2007

(30) Foreign Application Priority Data

Dec. 29, 2005 (KR) .................... 10-2005-0134179

(51) Int. Cl.
*H01L 21/336* (2006.01)
*H01L 21/8234* (2006.01)
*H01L 21/8236* (2006.01)

(52) U.S. Cl. ............... 438/286; 438/257; 438/278; 438/276; 257/315; 257/E21.409; 257/E21.209

(58) Field of Classification Search ............ 438/286, 438/257, 278, 276; 257/315, E21.409, E21.209
See application file for complete search history.

(56) References Cited

U.S. PATENT DOCUMENTS

| | | | | |
|---|---|---|---|---|
| 6,265,274 | B1 * | 7/2001 | Huang et al. | 438/305 |
| 6,709,921 | B2 * | 3/2004 | Yeh et al. | 438/257 |
| 7,244,676 | B2 * | 7/2007 | Lee | 438/672 |
| 2002/0168822 | A1 * | 11/2002 | Yang et al. | 438/278 |
| 2004/0126951 | A1 * | 7/2004 | Lee | 438/200 |

* cited by examiner

*Primary Examiner*—Michael S. Lebentritt
*Assistant Examiner*—Mohsen Ahmadi
(74) *Attorney, Agent, or Firm*—Sherr & Nourse, PLLC

(57) ABSTRACT

A transistor which may effectively control the short channel effect with a vertical transistor structure. This structure may prevent the degradation of a transistor's performance caused by the hot carrier effect. The transistor has a source region having a concentration of implanted impurity ions on a semiconductor substrate; a channel region having a cylindrical shape over the source region; a drain region formed over the channel region; a gate insulation layer formed over the source region, a side of the channel region, and the drain region; and a gate conductor extending over an upper portion and one side of the channel region.

8 Claims, 5 Drawing Sheets

TRANSISTOR OF SEMICONDUCTOR DEVICE AND METHOD FOR FABRICATING THE SAME

The present application claims priority under 35 U.S.C. 119 and 35 U.S.C. 365 to Korean Patent Application No. 10-2005-0134179 (filed on Dec. 29, 2005), which is hereby incorporated by reference in its entirety.

BACKGROUND

Currently, the width of transistors is getting continuously narrower due to ongoing transistor miniaturization aimed at achieving ever larger scale integration of semiconductor devices.

Hot carrier effects inside the transistor worsen as transistors shrink. When the length of a channel becomes much shorter while the rated operating voltage decreases little, the horizontal electric field becomes very high near the drain region. This can degrade electrical characteristics of the drain region through the generation of hole and electron pairs. The hot carrier effect produces holes which move toward the substrate.

The electrons move toward the gate, and may become trapped below the gate oxide film or a spacer. These trapped electrons have a cumulative effect on the threshold voltage of the transistor.

The hot carrier effect becomes more severe as higher electric fields are applied to the channel regions in the semiconductor substrate. The electric field gets higher because the power supply or rated operating voltage is relatively constant but the channel length is getting much shorter. The shorter the channel between source and drain, the worse the hot carrier effects.

To overcome the hot carrier effect, transistors may use an LDD (Lightly Doped Drain) structure. The structure has a graded junction where ion implantation density in the source and drain region is low around edges of the gate electrode and high around center of the gate electrode, thereby reducing and abrupt change in the voltage gradient, and reducing the electric field.

However, a transistor with an LDD structure suffers a short channel effect since the channel length is getting continuously shorter due to larger scale integration of semiconductor devices. Dopants in the LDD region diffuse into the channel and may create a high electric field in the channel edge near the drain, which causes the hot carrier effect that degrades performance of the transistor.

Moreover, during the operation of the transistor, impurities in source and drain regions diffuse laterally. The transistor may become more susceptible to a punch-through effect. It is difficult to formulate a process of ion implantation for preventing the punch-through effect. Also, it is difficult to control the threshold voltage when the channel length and the ion density control are not accurately controlled.

SUMMARY

Accordingly, embodiments relate to a semiconductor transistor device and a method of manufacture that substantially obviates one or more problems due to limitations and disadvantages in the related art.

Embodiments relate to a semiconductor transistor and a method of manufacture, which may effectively control the short channel effect with a vertical transistor structure. This structure may prevent the degradation of a transistor's performance caused by the hot carrier effect.

Additional advantages, objects, and features of the embodiments will be set forth in part in the description which follows and in part will become apparent to those having ordinary skill in the art upon examination of the following or may be learned from practical experience with the embodiments. The objectives and other advantages of the disclosed embodiments may be realized and attained by the structure particularly pointed out in the written description and claims hereof as well as the appended drawings.

To achieve these objects and other advantages and in accordance with the purpose of the embodiments, as embodied and broadly described herein, there is provided a transistor comprising a source region having a concentration of implanted impurity ions on a semiconductor substrate; a channel region having a cylindrical shape over the source region; a drain region formed over the channel region; a gate insulation layer formed over the source region, a side of the channel region, and the drain region; and a gate conductor extending over an upper portion and one side of the channel region.

The transistor may also have a conducting layer connecting to the source region, the drain region, and the gate conductor, and filling a hole made on an intercalary insulation film.

The channel region may be comprised of a conducting layer.

The drain region may be a short cylindrical layer stacked over the channel region having a concentration of implanted ions.

A hydrogen annealing may be performed on the semiconductor substrate prior to any selective epitaxial growth.

Embodiments relate to a method for fabricating a transistor including forming a first source or drain region by a first ion implantation process on a semiconductor substrate; depositing a first sacrificial layer over the semiconductor substrate, and dry etching a portion of the sacrificial layer to form a hole which exposes the first source or drain region; depositing and flattening a first conducting layer over the first sacrificial layer to form a channel region filling the hole; removing the first sacrificial layer; forming a second sacrificial layer over the first source and drain region and the channel region; performing a second ion implanting process on the channel region; removing the second sacrificial layer; forming a gate insulation layer over the channel region forming a gate conducting layer; dry etching the gate conducting layer to form a gate conductor extending over an upper portion and one side of the channel region; implanting ions to form a second source and drain region over the channel region; forming an intercalary insulation layer over the semiconductor substrate; etching the intercalary insulation layer to form contact holes exposing a portion of the first and second source and drain regions and the gate conductor; and depositing and patterning a second conducting layer over the intercalary insulation layer to fill the contact holes.

The flattening process for forming the channel region may be a CMP process.

The first and second sacrificial layers are removed by wet etching.

The second sacrificial layer may be used to protect the semiconductor substrate from the ion implantation process.

The gate insulation layer may be used as an etch stop layer during the etching of the gate conducting layer.

The second ion implantation may be used for controlling a threshold voltage of the transistor.

The second ion implantation process is performed by implanting ions on a side of the channel region with an angle between 30° and 60° with respect to a top surface of the semiconductor substrate.

The first sacrificial layer has a thickness equal to a length of the channel of the transistor.

It is to be understood that both the foregoing general description and the following detailed description of the embodiments are exemplary and explanatory and are intended to provide further explanation of the claims.

BRIEF DESCRIPTION OF THE DRAWINGS

Example

DETAILED DESCRIPTION

In drawings thickness of layers and regions is magnified for being shown clearly. The same parts indicate the same reference number in whole specification. When an expression of a portion existing "on" a layer, a film, a region, and a surface, etc. includes "directly above" it and higher than it. When one portion exists "directly above" another portion, it means two portions contact directly.

Figure 1:
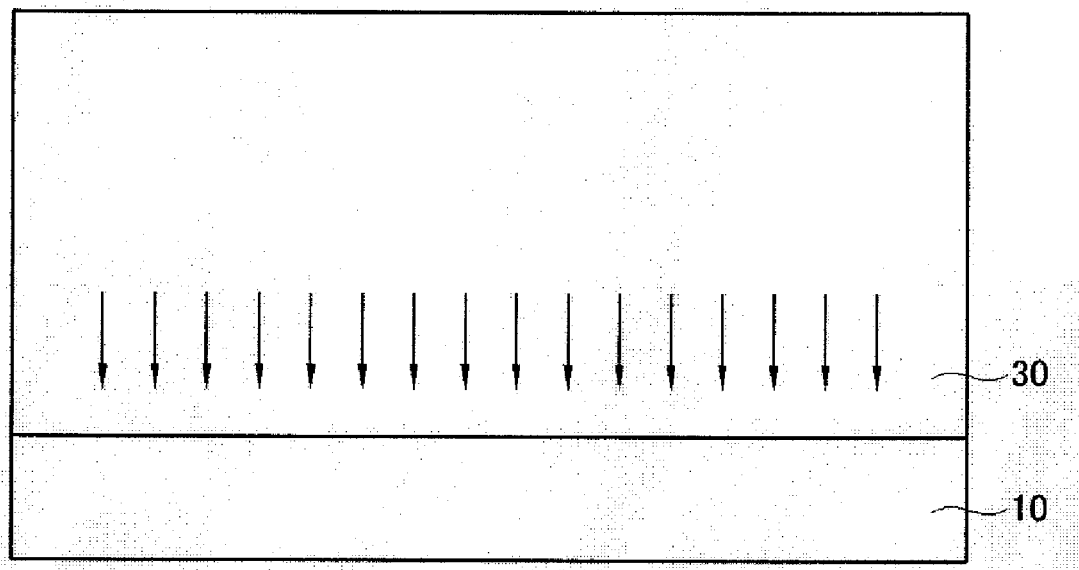
FIGS. 1 to 9 show processes of fabricating a transistor of a semiconductor device according to embodiments.

With reference to FIG. 1, impurity ions are implanted on a semiconductor substrate 10 to form a first source and drain region 30.

Figure 2:
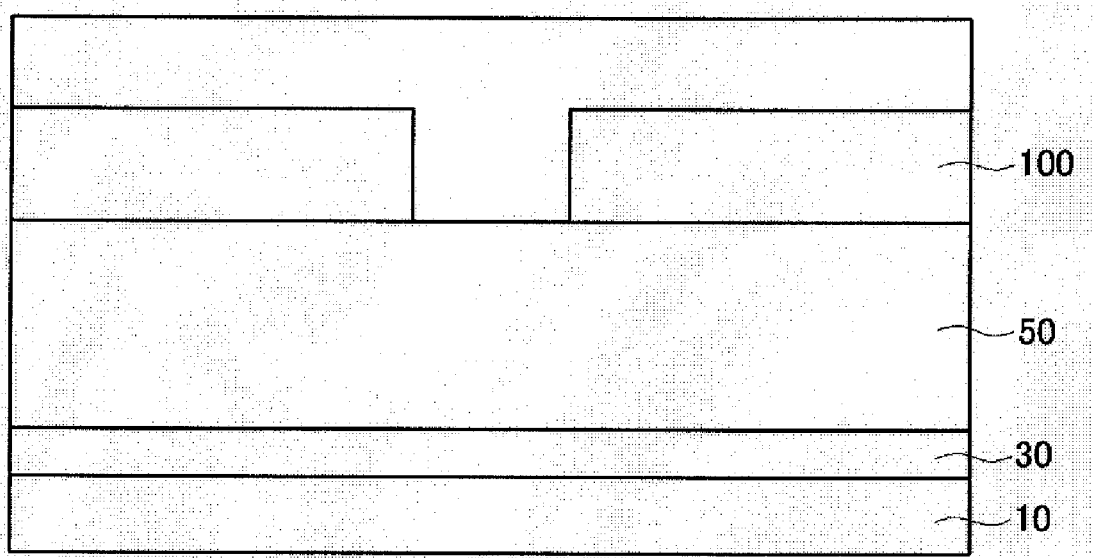

As shown in FIG. 2, a first sacrificial layer 50 is deposited over the semiconductor substrate 10 where a first source and drain region 30 is formed. A first photo-resist pattern 100 exposes a channel region on the first sacrificial layer 50. The first sacrificial layer 50 is dry etched using the first photo-resist pattern 100 as a mask to form a hole (70 of FIG. 3) for forming a channel region. Then the first photo-resist pattern 100 is removed. The first sacrificial layer 50 is the same length as a channel in the transistor fabricated by the method described below.

Figure 3:
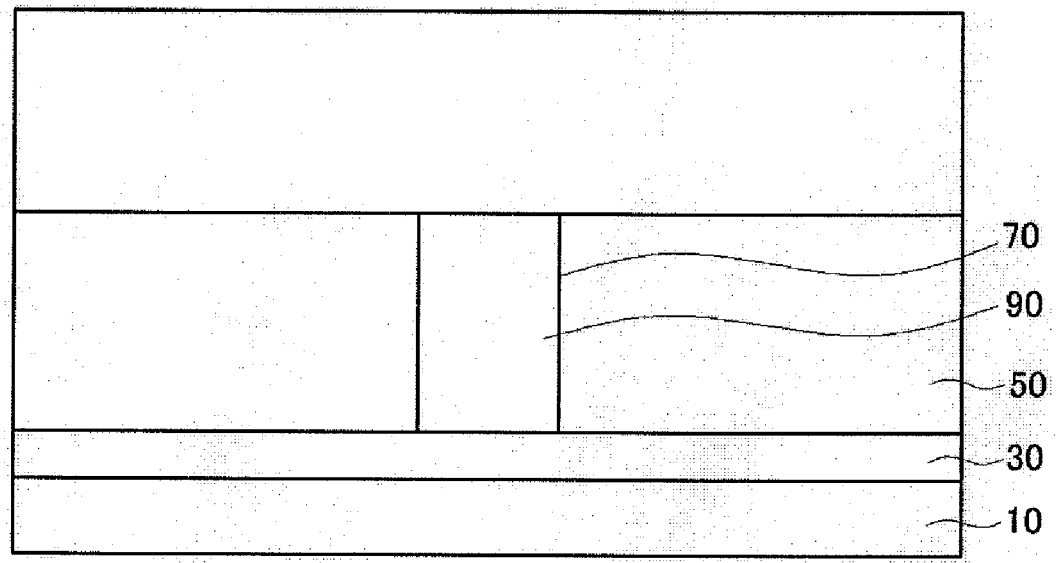

As shown in FIG. 3, a first conducting layer is deposited over the first sacrificial layer 50 and is flattened or planarized by using CMP(Chemical Mechanical Polishing) to form a channel region 90 which fills the hole. The channel of the transistor according to embodiments is formed in this channel region 90. The chemical mechanical polishing may progress until the first sacrificial layer 50 is exposed.

Figure 4:
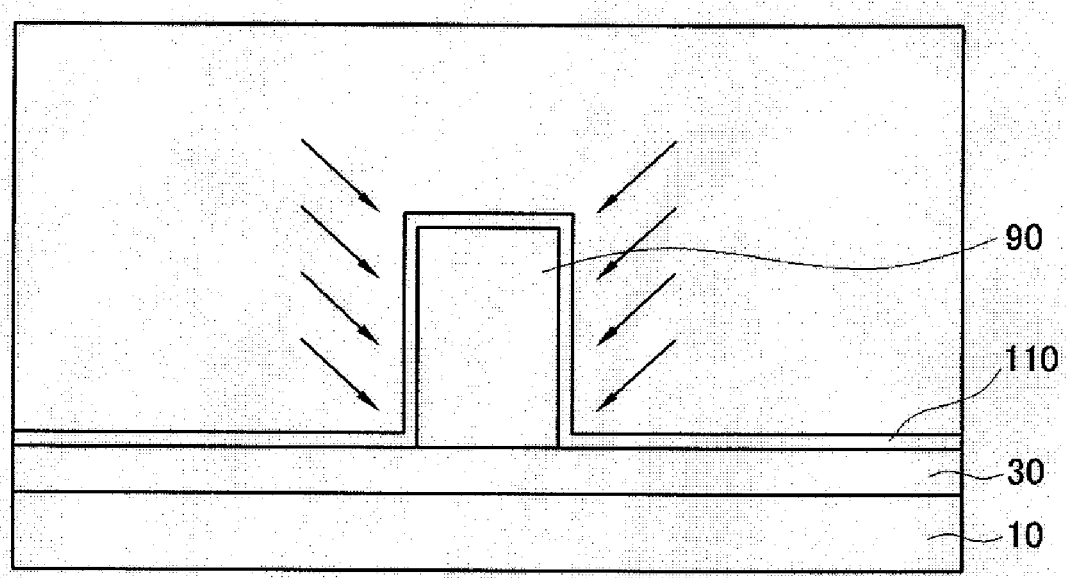

As shown in FIG. 4, the first sacrificial layer 50 is completely removed using a wet etching method, and a second sacrificial layer 110 is formed over the first source and drain region 30 and the channel region 90. The second sacrificial layer 110 is formed by oxidation. An ion implantation process is performed for controlling a threshold voltage of the transistor to be formed. The second sacrificial layer 110 is a buffer layer for protecting the substrate during ion implantation processes. The ions are implanted on the sides of the channel region with an angle between 30° and 60°.

Figure 5:
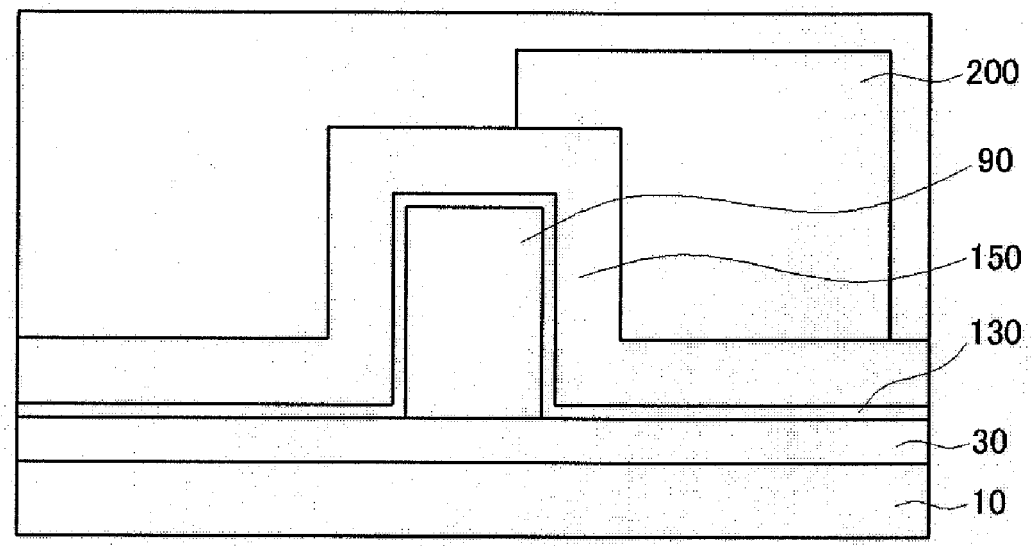

As shown in FIG. 5, the second sacrificial layer 110 is removed by using a wet etching method. A gate insulation layer 130 is formed over the first source and drain region 30 and the channel region 90. A gate conducting layer 150 is formed over the gate insulation layer 130. A second photo-resist pattern 200 is formed over an upper portion and one side of the gate conducting layer 150.

Figure 6:
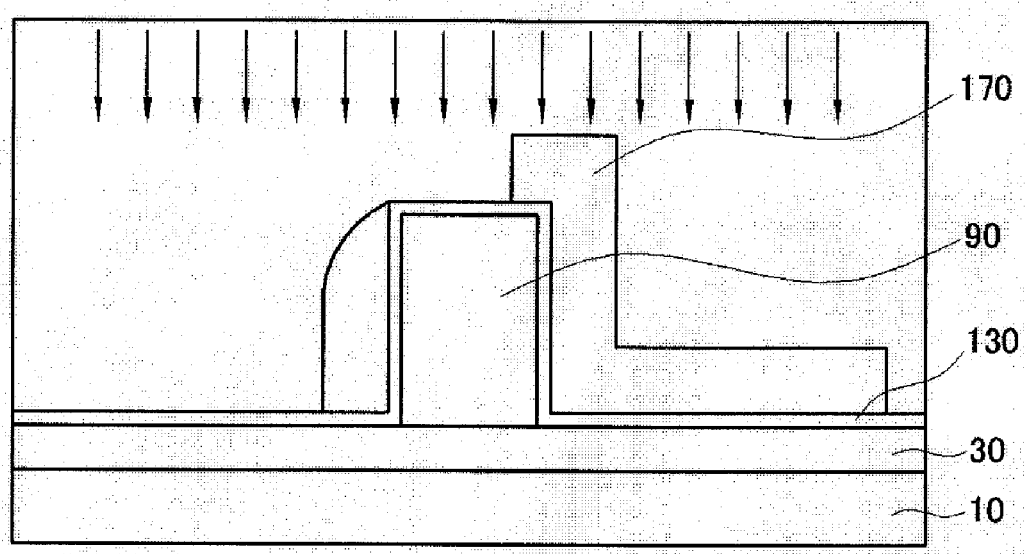

As shown in FIG. 6, the gate conducting layer 150 is dry etched using the second photo-resist pattern 200 as a mask to form a gate conducting layer 170, which surrounds one side of the channel region 90. The gate insulation layer 130 is used as an etching stop layer. A part of the gate conducting layer 150 may remain on another side of the channel region 90 after the etching of the gate conducting layer 150. The second photo resist pattern 200 is then removed. Ions are implanted into the substrate to form a second source and drain region 210 over the channel region.

Figure 7:
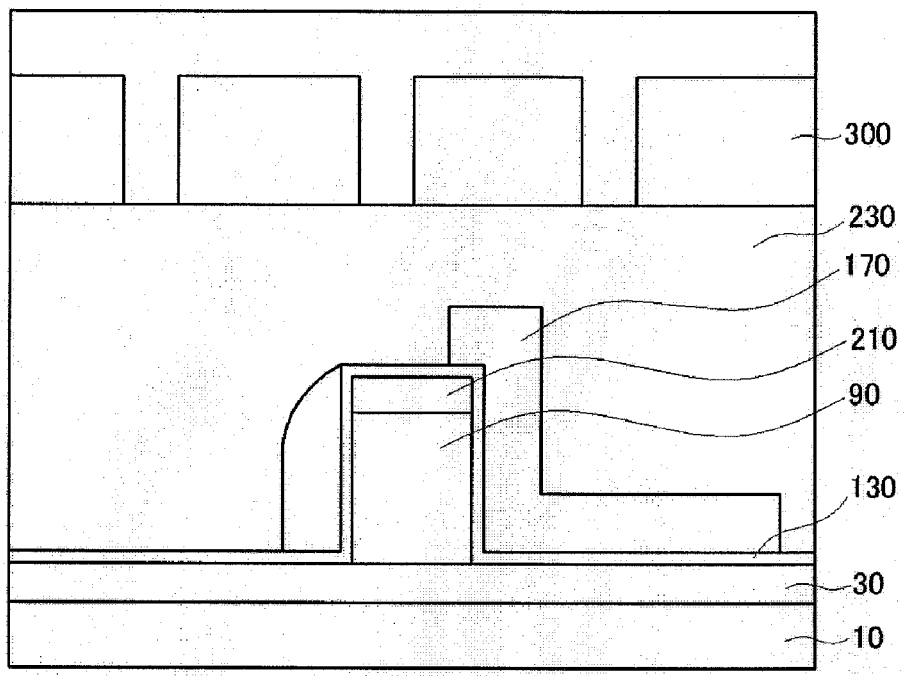

As shown in FIG. 7, an intercalary insulation layer 230 is formed over the substrate, and a third photo resist pattern 300 is formed to expose an upper region where contact holes may be formed.

Figure 8:
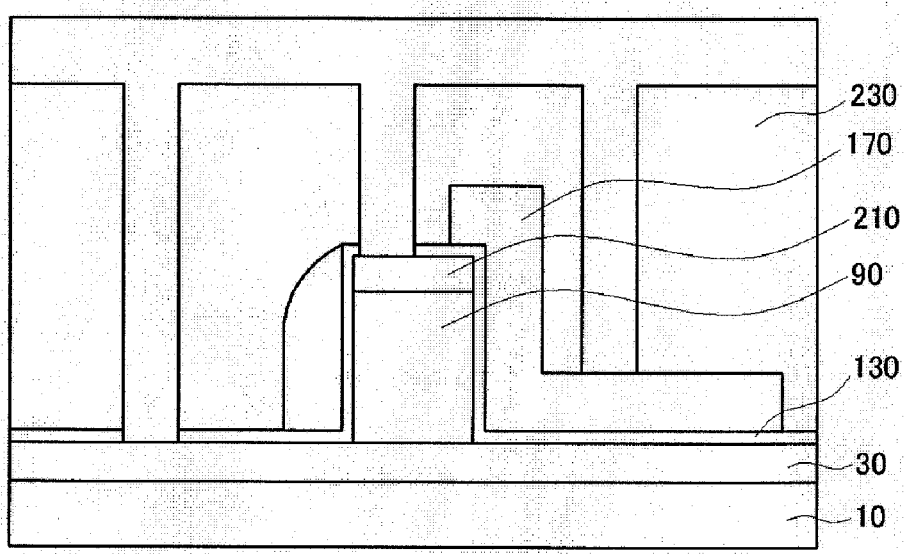

As shown in FIG. 8, the intercalary insulation layer 230 and the gate insulation layer 130 are etched using the third photo resist pattern 300 as the mask. The third photo resist pattern 300 is removed after exposing a portion of the first and the second source and drain regions and a portion of the gate conductor.

Figure 9:
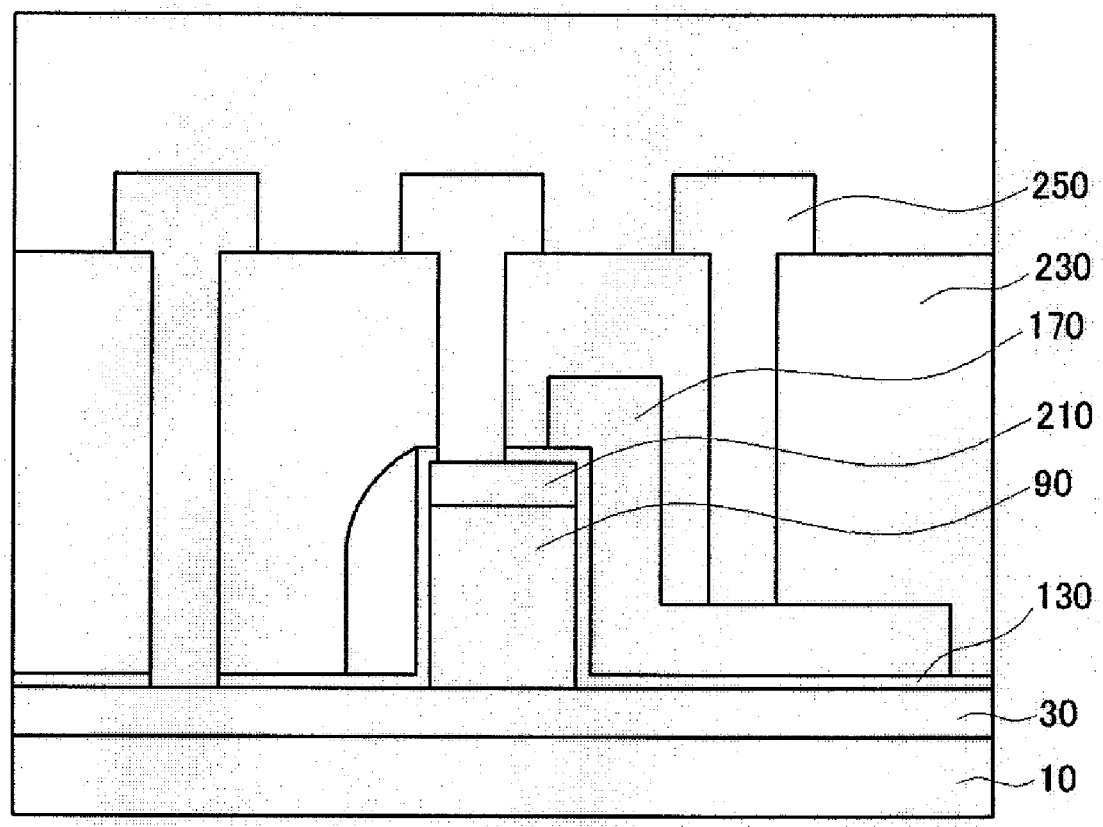

As shown in FIG. 9, a second conducting layer is deposited and patterned over the intercalary insulation layer 230 and in the contact holes to form the second conductor layer 250 for connecting to a gate, a source, and a drain.

In the transistor, one of regions 30 and 210 is designated as a source and the other is designated as a drain. The channel region 90 forms the channel of the transistor. The gate conductor 170 functions as a gate. The gate, the source, and the drain are connected to external through the second conductor layer 250.

Thus, the transistor according to the embodiments has a vertical shape. The length of the effective channel is longer than that of the related transistor, thereby reducing the short channel effect. Therefore, the transistor may be integrated on a large scale while effectively controlling the short channel effect.

The short channel effect is decreased by manufacturing a vertical transistor, thereby increasing the length of the effective channel. Degradation of transistor performance is prevented by controlling the hot carrier effect, allowing the transistor according to embodiments to be integrated on a very large scale.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method for fabricating a transistor comprising:

forming a first source or drain region by a first ion implantation process on a semiconductor substrate;

depositing a first sacrificial layer over the semiconductor substrate, and dry etching a portion of the sacrificial layer to form a hole which exposes the first source or drain region;

depositing and flattening a first conducting layer over the first sacrificial layer to form a channel region filling the hole;

removing the first sacrificial layer;

forming a second sacrificial layer over the first source and drain region and the channel region;

performing a second ion implanting process on the channel region;

removing the second sacrificial layer;

forming a gate insulation layer over the channel region forming a gate conducting layer;

dry etching the gate conducting layer to form a gate conductor extending over an upper portion and one side of the channel region;

implanting ions to form a second source and drain region over the channel region;

forming an intercalary insulation layer over the semiconductor substrate;

etching the intercalary insulation layer to form contact holes exposing a portion of the first and second source and drain regions and the gate conductor; and depositing and patterning a second conducting layer over the intercalary insulation layer to fill the contact holes.

2. The method according to claim 1, wherein the flattening process for forming the channel region is a CMP process.

3. The method according to claim 1, wherein the first and second sacrificial layers are removed by wet etching.

4. The method according to claim 1, wherein the second sacrificial layer is used to protect the semiconductor substrate from the ion implantation process.

5. The method according to claim 1, wherein the gate insulation layer is used as an etch stop layer during the etching of the gate conducting layer.

6. The method according to claim 1, wherein the second ion implantation is used for controlling a threshold voltage of the transistor.

7. The method according to claim 1, wherein the second ion implantation process is performed by implanting ions on a side of the channel region with an angle between 30° and 60° with respect to a top surface of the semiconductor substrate.

8. The method according to claim 1, wherein the first sacrificial layer has a thickness equal to a length of the channel of the transistor.

* * * * *